(12) United States Patent
Kodaira et al.

(10) Patent No.: US 7,344,785 B2
(45) Date of Patent: *Mar. 18, 2008

(54) COPPER FOIL FOR PRINTED CIRCUIT BOARD, METHOD FOR FABRICATING SAME, AND TRIVALENT CHROMIUM CONVERSION TREATMENT SOLUTION USED FOR FABRICATING SAME

(75) Inventors: Muneo Kodaira, Tsuchiura (JP); Shingo Watanabe, Tsuchiura (JP); Gen Sasaki, Tsuchiura (JP); Yasuyuki Ito, Tsuchiura (JP); Katsumi Nomura, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/249,452

(22) Filed: Oct. 14, 2005

(65) Prior Publication Data

US 2006/0257680 A1 Nov. 16, 2006

(30) Foreign Application Priority Data

May 16, 2005 (JP) .............................. 2005-143274

(51) Int. Cl.
*B32B 15/20* (2006.01)

(52) U.S. Cl. ...................... 428/675; 428/209; 428/615; 428/626; 428/658; 174/257

(58) Field of Classification Search ................ 428/209, 428/620, 615, 675, 626, 658
See application file for complete search history.

(56) References Cited

U.S. PATENT DOCUMENTS

| | | | | |
|---|---|---|---|---|
| 4,387,006 A | * | 6/1983 | Kajiwara et al. ............ | 205/111 |
| 4,801,337 A | * | 1/1989 | Higgins ....................... | 148/267 |
| 4,966,634 A | * | 10/1990 | Saeki et al. .................. | 148/251 |
| 5,022,938 A | * | 6/1991 | Wieczerniak ................ | 148/267 |
| 5,230,932 A | * | 7/1993 | Chen et al. .................. | 428/607 |
| 5,861,076 A | * | 1/1999 | Adlam et al. ................ | 156/281 |
| 6,329,074 B1 | * | 12/2001 | Fujiwara et al. ............. | 428/632 |
| 6,605,369 B1 | * | 8/2003 | Takahashi et al. ........... | 428/623 |

FOREIGN PATENT DOCUMENTS

| | | |
|---|---|---|
| GB | 1 558 919 | 1/1980 |
| JP | 52-145769 | 12/1977 |
| JP | 6-54829 B2 | 3/1994 |
| JP | 3142259 B2 | 12/2000 |
| JP | 2005-8972 A | 1/2005 |
| JP | 2005-42139 A | 2/2005 |

* cited by examiner

*Primary Examiner*—Cathy F. Lam
(74) *Attorney, Agent, or Firm*—Foley & Lardner LLP

(57) ABSTRACT

A copper foil 1 comprises a roughened plating layer 2, a Ni—Co alloy plating layer 3, a zinc galvanized (underlying) layer 4, a chromate treatment layer 5, and a silane coupling treatment layer 6 on a surface to be bonded with a base material for a printed circuit board, and the chromate treatment layer 5 is formed by using a trivalent chromium conversion treatment solution containing 70 mg/L or more and less than 500 mg/L of trivalent chromium ions converted into metal chromium and having a pH-value of 3.0 to 4.5. According to the present invention, a copper foil for a printed circuit board, a method for fabricating the same, and a trivalent chromium conversion treatment solution used for fabricating the same, which have an excellent controllability in Zn film forming amount and chromate film forming amount can be obtained.

8 Claims, 9 Drawing Sheets

- 23A CHROMATE FILM
- 22A Zn FILM
- 21 COPPER FOIL

- 23B CHROMATE FILM
- 22B Zn FILM
- 21 COPPER FOIL

COPPER FOIL FOR PRINTED CIRCUIT BOARD, METHOD FOR FABRICATING SAME, AND TRIVALENT CHROMIUM CONVERSION TREATMENT SOLUTION USED FOR FABRICATING SAME

The present application is based on Japanese Patent Application No. 2005-143274 filed on May 16, 2005, the entire contents of which are incorporated herein by reference.

BACKGROUND OF THE INVENTION

1. Field of the Invention

The present invention relates to a copper foil for a printed circuit board, a method for fabricating the same, and a trivalent chromium conversion treatment solution used for fabricating the same, and more particularly, to a copper foil for a printed circuit board, a method for fabricating the same, and a trivalent chromium conversion treatment solution used for fabricating the same, which has an excellent stability of Zn and chromate plating film forming amounts.

2. Description of the Related Art

A copper foil or a copper alloy foil (hereinafter, referred to simply as "copper foil") is widely used for the purpose of a conductor (conductive member or conductive strip). Particularly in the field of the flexible printed circuit (FPC), a printed circuit board is manufactured by layering (laminating) a copper foil on a polyimide film or by coating a copper foil with a varnish mainly composed of polyamic acid. Hereinafter, materials such as polyimide film, varnish, or solidified varnish to be used for the printed circuit board are referred as "base material (substrate) for a printed circuit board" or simply as "base material".

A good bonding is required between the copper foil and the base material for a printed circuit board. Therefore, the roughening treatment is frequently conducted for an bonding surface of the copper foil to increase an anchoring effect, thereby improving the bonding with the base material for a printed circuit board.

The copper foil is classified into an electro-deposited copper foil and a rolled copper foil according to the manufacturing method therefor. However, the roughening treatment is conducted in similar manner for these two types of copper foils. For example, as a manner of roughening treatment, a manner of applying (depositing) copper in the form of rice-grains on a surface of the copper foil by burnt plating and a manner of selectively etching grain boundaries by using acid are generally used.

As to the roughening treatment using the burnt plating, the roughening treatment by alloy platings has been developed in addition to the usual copper plating. Japanese Patent Laid-Open (Kokai) No. 52-145769 (JP-A-52-145769) discloses copper-nickel alloy plating as a representative example of alloy platings.

In addition, as to a surface treatment after such a roughening treatment, Japanese Patent Publication for Opposition (Kokoku) No. 6-54829 (JP-B-6-54829) proposes to provide a cobalt plating or cobalt-nickel alloy plating, etc.

On one hand, as to a method for improving the bonding with the base material, there is a method for providing an anchoring effect by using the roughening treatment (improvement in physical bondability), as described before. Further, there is also a step for improving a chemical bondability between the copper foil and the base material for a printed circuit board by a surface treatment for providing a metallic layer with a high affinity with the base material on a surface of the copper foil.

Conversion treatment such as so-called chromate treatment or silane-coupling treatment conducted for a surface of the copper foil is an example of the method for providing the metallic layer with the high affinity with the base material on the copper foil surface. The chromate treatment and silane-coupling treatment are methods for the purpose of rust preventing the surface of the copper foil as well as for the purpose of improving the bondability with the base material for a printed circuit board, as disclosed in Japanese Patent No. 3142259 and Japanese Patent Laid-Open (Kokai) No. 2005-8972 (JP-A-2005-8972). In addition, the rust prevention (corrosion resistance, oxidation resistance) effect is expected (required) also for the surface of the copper foil, which is a surface not to be bonded with the base material (the back side of the bonding surface).

As disclosed in the JP-B-6-54829, Japanese Patent No. 3142259, and JP-A-2005-8972, the chromate treatment has been conducted by immersing the copper foil to be treated in a treatment solution containing hexavalent chromium, or by electrolyzing the copper foil which is provided as an anode or a cathode in the chromate treatment solution. However, considering the recent emphasis on the environmental protection, the conversion treatment free of any hexavalent chromium has been developed.

As an example of the conversion treatment free of any hexavalent chromium, the chromate treatment using a treatment solution containing trivalent chromium is best exploited and commercialized. In the present invention, such a treatment is indicated as "trivalent chromium conversion treatment", or simply as "(trivalent) chromate treatment". However, the treatment solution actually on the market has been developed as a treatment solution for the purpose of plating of the automotive parts. Therefore, a Zn film used as a underlying layer for the chromate treatment is thick (equal to or more than about 2 µm), and the chromate film is formed to be thick.

On the other hand, the treatment film forming amount required for the purpose of electronic parts, such as the copper foil for a FPC, is generally 3 to 5 $\mu m/cm^2$ for Zn and 0.3 to 0.5 $\mu m/cm^2$ for Cr (measured by Inductively Coupled Plasma-Atomic Emission Spectrometry (ICP-AES), conversion unit of the chromate film is Cr). Converting the ranges of the film forming amount into ranges for film thickness, the total thickness of the Zn film and chromate film is several nanometers to several dozens nanometers.

The film forming amounts and film thicknesses of the Zn film and chromate film required for the purpose of the electronic parts are smaller (thinner) by 2 or 3 orders, compared with those for the purpose of the automotive parts. Therefore, it is not appropriate to use the chromate treatment solution for processing the automotive parts as the chromate treatment solution for processing the electronic parts.

The thickness of respective chromate treatment films formed on the copper foil for a printed circuit board is very thin. Therefore, it is difficult to observe or analyze the film thickness by an energy dispersive X-ray spectrometry or scanning electron microscope, so that the film thickness is often observed or analyzed by the ICP-AES measurement.

As an example for responding to the above requirements, Japanese Patent Laid-Open No. 2005-42139 (JP-A-2005-42139) discloses a treatment solution containing trivalent chromium for plating the electronic parts. In JP-A-2005-42139, a chromate treatment solution which is an aqueous solution free of hexavalent chromium ion, but containing 1.4 mg/L or more and less than 125 mg/L of trivalent chromium ions, 0.8 mg/L or more and less than 40 mg/L of fluorine ions, 2.5 mg/L or more and less than 70 mg/L of nitric acid is disclosed.

However, according to the chromate treatment using a conventional and commercially available treatment solution containing the trivalent chromium, the zinc (Zn)-plating layer may dissolve (elute) in mass. Therefore, it is necessary to form the zinc galvanized layer thick for adjusting a Zn film forming amount to a required value. If the Zn film forming amount is small (i.e. the film thickness is thin), the controllability of the Zn film forming amount (namely, film thickness) will be deteriorated (i.e. it is difficult to control the Zn film forming amount). Further, since the Zn film forming amount affects the chromate film forming amount, the controllability of the chromate film forming amount (namely, film thickness) will be deteriorated. As a result, an excessively formed chromate film may give adverse effects to the bonding with the base material such as polyimide, etching controllability, Sn-plating solution resistance, etc.

In addition, according to the chromate treatment using the treatment solution containing the trivalent chromium disclosed in JP-A-2005-42139, the zinc galvanized film and chromate treatment film can be formed with a predetermined film thickness of nanometer order. However, the improvement in controllability of Zn film forming amount and chromate film forming amount is not described.

SUMMARY OF THE INVENTION

Accordingly, it is an object of the invention to provide a copper foil for a flexible printed circuit board, a method for fabricating the same, and a trivalent chromium conversion treatment solution used for fabricating the same, having an excellent controllability of Zn film forming amount and chromate film forming amount.

According a first feature of the invention, a copper foil for a printed circuit board comprises:

a copper foil composed of copper or copper alloy and having a surface to be faced to a base material for a printed circuit board;

a zinc galvanized layer provided on the bonding surface; and a trivalent chromate treatment layer directly formed on the zinc galvanized layer;

wherein the trivalent chromate treatment layer is formed by using a trivalent chromium conversion treatment solution containing 70 mg/L or more and less than 500 mg/L of trivalent chromium ions converted into metal chromium and having a pH-value of 3.0 to 4.5.

In the present invention, even when it is merely described as "trivalent chromium ionic concentration", the concentration is indicated by a value converted into metal chromium concentration.

An alloy plating layer composed of Ni and Co may be provided beneath the zinc galvanized layer, and a total coating amount of the Ni and Co is 5 to 20 µg/cm², and a concentration of the cobalt in the alloy layer is 60 to 80 mass %.

A coating amount of the Zn of the zinc galvanized layer is preferably 0.5 to 3 µg/cm².

According to a second feature of the present invention, a method for fabricating a copper foil for a printed circuit board, comprises the steps of:

forming a zinc galvanized layer on a surface of a copper foil to be faced to a base material for a printed circuit board; and conducting a trivalent chromate treatment by immersing the copper foil into a trivalent chromium conversion treatment solution containing 70 mg/L or more and less than 500 mg/L of trivalent chromium ions converted into metal chromium and having a pH-value of 3.0 to 4.5 to form a trivalent chromate treatment layer directly on the zinc galvanized layer.

According to a third feature of the present invention, a trivalent chromium conversion treatment solution, for forming a trivalent chromate treatment layer directly on a zinc galvanized layer provided on a copper foil for a printed circuit board, contains trivalent chromium ions of 70 mg/L or more and less than 500 mg/L converted into metal chromium and having a pH-value of 3.0 to 4.5

According to the present invention, a copper foil for a flexible printed circuit board having an excellent controllability of Zn film forming amount and chromate film forming amount can be realized.

BRIEF DESCRIPTION OF THE DRAWINGS

The present invention will be explained in more detail in conjunction with appended drawings, wherein:

FIGS. 4A and 4B are graphs showing the Zn film forming amount and Cr film forming amount when using the chromate treatment solution with a trivalent chromium ionic concentration of 900 mg/L, wherein FIG. 4A shows the relationship between the Zn film forming amount and Cr film forming amount for the S-surface, and FIG. 4B shows the relationship between the Zn film forming amount and Cr film forming amount for the M-surface;

FIGS. 5A and 5B are graphs showing the Zn film forming amount and Cr film forming amount when using the chromate treatment solution with a trivalent chromium ionic concentration of 300 mg/L, wherein FIG. 5A shows the relationship between the Zn film forming amount and Cr film forming amount for the S-surface, and FIG. 5B shows the relationship between the Zn film forming amount and Cr film forming amount for the M-surface;

FIGS. 6A and 6B are graphs showing the Zn film forming amount and Cr film forming amount when using the chromate treatment solution with a trivalent chromium ionic concentration of 150 mg/L, wherein FIG. 6A shows the relationship between the Zn film forming amount and Cr film forming amount for the S-surface, and FIG. 6B shows the relationship between the Zn film forming amount and Cr film forming amount for the M-surface;

FIGS. 7A and 7B are model schematic diagrams showing a relationship between the Zn film forming amount and chromate film forming amount, wherein FIG. 7A shows a case where the Zn film forming amount is large, and FIG. 7B shows a case where the Zn film forming amount is small;

FIGS. 8A and 8B are graphs showing the relationship between a pH-value and a trivalent chromium ionic concentration of the chromate treatment solution and a Zn film dissolution amount, wherein FIG. 8A shows the relationship thereof for the S-surface, and FIG. 8B shows the relationship thereof for the M-surface; and FIGS. 9A and 9B are graphs showing the relationship between the pH-value and the trivalent chromium ionic concentration of the chromate treatment solution and Zn film forming amount, wherein FIG. 9A shows the relationship thereof for the S-surface, and FIG. 9B shows the relationship thereof for the M-surface.

PREFERRED EMBODIMENT OF THE INVENTION

A preferred embodiment of the present invention will be explained in detail hereinafter with referring to the appended drawings.

(Structure of a Copper Foil for a Printed Circuit Board)

Figure 1:
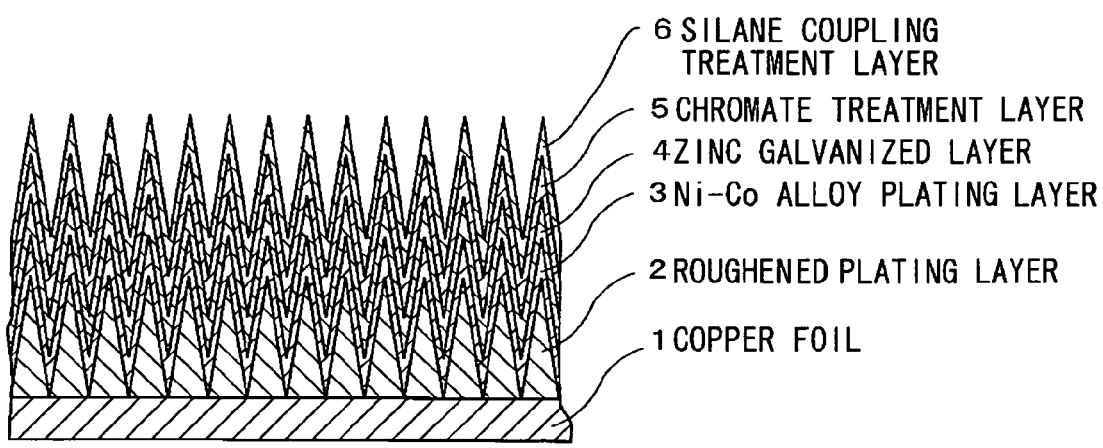
FIG. 1 is a cross sectional schematic diagram showing a surface structure of a copper foil in a preferred embodiment according to the present invention.

FIG. 1 is a cross sectional schematic view showing a structure of a copper foil for a printed circuit board in a preferred embodiment according to the present invention.

On a copper foil 1, a roughened plating layer 2 is formed on a surface of the copper foil 1 to be bonded with a base material for a printed circuit board. A Ni—Co alloy plating layer 3, a zinc galvanized layer 4, a chromate treatment layer (trivalent chromate conversion layer) 5, and a silane coupling treatment layer 6 are successively formed on the roughened plating layer 2 to have a layered (laminated) structure. In the present invention, either an electro-deposited copper foil or a rolled copper foil may be used for the copper foil 1. In addition, although they are not shown in the drawings, it is preferable to further provide a Ni—Co alloy plating layer, a zinc galvanized layer, and a trivalent chromate treatment layer on another surface of the copper foil 1, so as to realize the rust prevention (corrosion resistance, oxidation resistance) effect. Herein, another surface of the copper foil 1 is not bonded to the base material (i.e. a back surface of the bonding surface), and is a non-roughened surface, to which a copper roughened plating treatment is not conducted.

(Roughening Treatment)

In the present invention, the roughening treatment may be or may not be conducted for the copper foil 1. However, it is preferable to conduct the roughening treatment. The roughening treatment is usually conducted by selective etching of a grain boundary of the copper foil 1 or by burnt plating of a copper or copper alloy. Japanese Patent No. 3142259 discloses an example of the roughening treatment conducted by the burnt plating.

In the roughening treatment by the plating, a small amount of a metal element other than copper may be doped. An example of the surface roughening treatment method to be conducted to the copper foil for a printed circuit board is explained below. A plating bath is an acidic copper plating bath mainly composed of a copper sulfate and a sulfuric acid, to which at least one metal selected from the group consisting of iron, nickel, cobalt, molybdenum, tungsten, titanium, and aluminum and an organic compound such as gelatin are doped. The electrolytic treatment is conducted for a bonding surface of the copper foil 1 with an electric current having a current density greater than a critical current density, so as to form a dendritic copper electro-deposited layer. The electrolytic treatment is further conducted for the dendritic copper electro-deposited layer formed on the copper foil 1 with an electric current having a current density less than the critical current density, so as to transform the dendritic copper into a nodulus copper.

As optimum condition in this method, for example, a doping amount of at least one selected from the group consisting of iron, nickel, and cobalt is 1 to 10 g/L, a doping amount of at least one selected from the group consisting of the molybdenum and tungsten is 0.1 to 1 g/L, a doping amount of at least one selected from the group consisting of the titanium and aluminum is 0.01 to 5 g/L, and a doping concentration of the gelatin is 0.1 to 1000 ppm.

As an example, the electrolytic treatment is conducted by using the plating bath doped with 28 g/L of copper, 125 g/L of sulfuric acid, 4 g/L of iron, 0.3 g/L of molybdenum, and 0.3 ppm of tungsten is used, at a solution temperature of 40° C. The dendritic copper electro-deposited layer is formed by using the current with a current density of 40 to 50 A/dm$^2$ for a treatment time of 3 to 5 seconds. Following the aforementioned roughening treatment, a copper plating layer with a uniform thickness may be provided along the roughened contour, so as to control convexo-concave profile of the surface (i.e. to prevent undesired change of the convexo-concave profile or to prevent the loss of convex portions).

In case of using the rolled copper foil, the copper plating may be applied prior to the roughening treatment for removing the irregularity of the surface of the rolled copper foil, to smoothen the surface. A thickness of the resulting copper plated layer is preferably 1 μm or more and less than 5 μm. The electrolytic treatment in the copper plating bath is preferably conducted under the conditions where the plating bath is composed of 120 to 200 g/L of copper sulfate, 70 to 150 g/L of sulfuric acid, and 30 to 150 ppm of gelatin, and the current density is 1 to 5 A/dm$^2$.

(Trivalent Chromate Treatment)

As a trivalent chromium conversion treatment solution used for the trivalent chromate treatment, it is preferable to use an aqueous solution substantially free of hexavalent chromium ion and containing the trivalent chromium ions. The trivalent chromium ion contained in this solution is, as converted into metal chromium, 70 mg/L or more and less than 500 mg/L, preferably 110 mg/L or more and 400 mg/L or less, and more preferably 150 mg/L or more and 300 mg/L or less. The pH-value of this solution ranges from 3.0 to 4.5, preferably from 3.5 to 4.0, and more preferably from 3.6 to 3.8. If the pH-value is greater than 4.5 (pH>4.5), the stability (solubility) of chromium ions in the plating solution will be decreased, and the chromium ions will be easily deposited or precipitated in form of hydroxides. Therefore, it becomes difficult to control the formation of the chromium film (coating).

By setting the trivalent chromium ionic concentration of the trivalent chromium conversion treatment solution within a range from 70 to 500 mg/L and setting pH-value of the plating solution as high as possible but in a range where the plating solution will not become unstable (unexpected deposition will not be produced), it is possible to realize the trivalent chromium conversion treatment solution for providing the copper foil for a printed circuit board having an excellent controllability of Zn film forming amount and chromate film forming amount. It is most preferable to use the trivalent chromium conversion treatment solution having a trivalent chromium ion concentration ranging from 150 to 300 mg/L and pH-value of 3.8 (the upper limit of pH-value is 3.8, and a control range of pH-value is 3.6 to 3.8). By using this trivalent chromium conversion treatment solution, the controllability of Zn film forming amount and chromate film forming amount (film thickness) can be significantly improved. Further, for the environmental protection and reduction in the fabrication cost, it is preferable to use the solution free of fluoride ion.

The trivalent chromium ions may be provided from either of nitric acid chromium, chromium sulfate, and chromium chloride.

For decreasing the pH-value (i.e. increasing a degree of acidity) of the conversion treatment solution, it is preferable to use the aqueous nitric acid solution. On the other hand, for increasing the pH-value (i.e. decreasing the degree of acidity) of the conversion treatment solution, it is preferable to use the aqueous sodium hydroxide solution. The conversion treatment is conducted by immersing the copper foil 1 in the treatment solution. The treatment temperature is preferably around a room temperature (around 15 to 40° C.). A treatment time is not limited to a particular time period. However, it is preferable to adjust the treatment time within a range of 1 to 20 seconds, with considering the speed of manufacture line.

Figure 2:
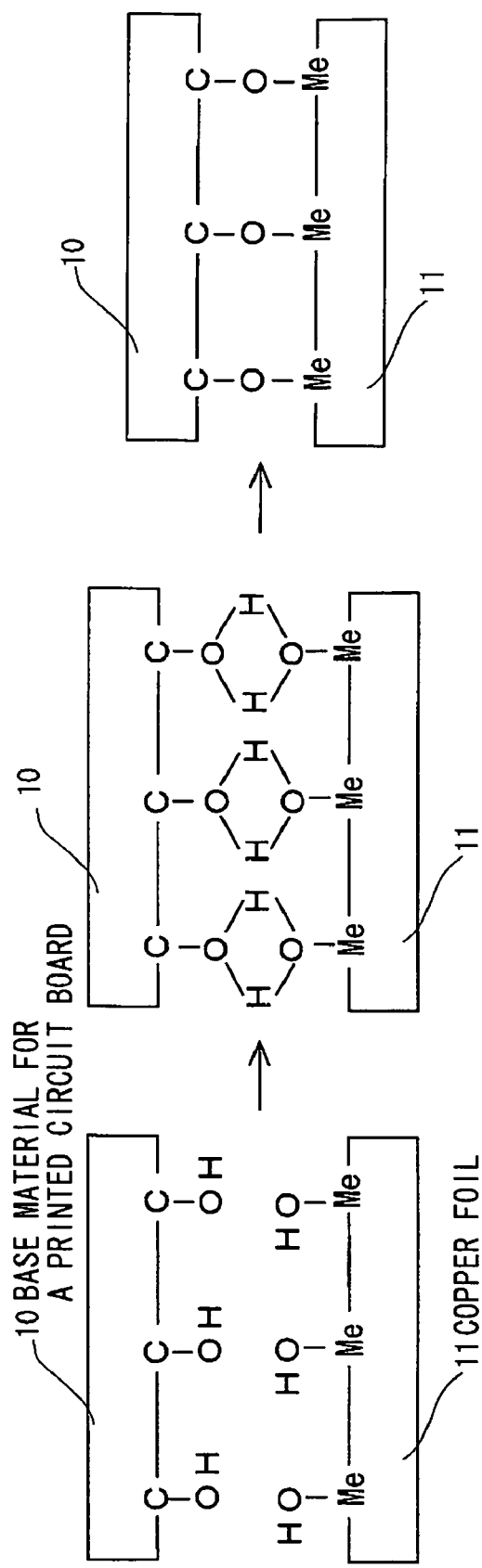
FIG. 2 is a diagram showing a behavior model of an interface in bonding between the copper foil and a base material for a printed circuit board.

FIG. 2 is a diagram showing a behavior model of an interface in bonding between the copper foil and the base material for a printed circuit board. In strict, the interface may be affected by ions existing in vicinity of the interface or additives included in the base material 10 for a printed circuit board, other than a binding reaction as shown in FIG. 2. However, the effect of these elements is ignored here.

It is assumed that the chromium coating made by the conversion treatment is composed of a mixture of metallic chromium, chromium hydroxide, and chromium oxide. Further, it is believed that hydroxyl group (i.e. OH group, which is represented by the chromium hydroxide) plays an important role in the bonding with the base material and in the silane coupling treatment as explained later.

It is assumed that the bonding of a copper foil 11 with the base material 10 for a printed circuit board is conducted as follows. OH groups at a surface of the copper foil 11 move close enough to the OH groups at a surface of the base material 10 for a printed circuit board, so that the hydrogen bonding occurs firstly. At the time of a heating step in a pressing process or resin curing process that is successively conducted, a dehydration occurs at a hydrogen bonding part, so that the copper foil 11 and the base material 10 are covalently bonded. As a result, the bonding force (binding power) becomes strong. However, when a coating amount of the chromium exceeds 2.5 µg/cm², the chromium layer itself becomes thick and fragile, therefore an exfoliation (peeling) in the chromium layer easily occurs. As a result, the bonding force with the copper foil 11 is decreased.

(Pretreatment of the Trivalent Chromate Treatment)

Referring again to FIG. 1, the pretreatment of the trivalent conversion treatment will be explained.

Prior to the trivalent chromate treatment, it is preferable to provide a Ni—Co alloy plating. The Ni—Co alloy plating is generally carried by a following method. Cobalt salt is dissolved with a constant concentration in a nickel-plating solution such as Watt-type plating bath or sulfamate plating bath, and nickel and cobalt are simultaneously electrodeposited by a galvanic electroplating treatment.

The Ni—Co alloy plating layer 3 suppresses the alloying of the copper foil 1 and zinc galvanized layer 4 described later. When the copper and zinc diffuses to form an alloy layer (brass layer), the exfoliation (peeling) will easily occur at an interface of the copper and brass as well as the rust prevention effect will decrease. Although either nickel or cobalt alone plating has an effect of preventing a discoloration due to oxidation and an effect of preventing discoloration due to moisture by itself, these effects can be improved in the Ni—Co alloy plating.

It is considered that the cobalt functions like a so-called catalyst, i.e. function to activate a reaction of a polyimide, particularly when the polyimide is employed as a base material for a printed circuit board to be bonded. In addition, it is found that alkali etching characteristics are improved by the use of the Ni—Co alloy in comparison with those of the nickel-plating alone.

The coating amount of the Ni—Co plating is preferably 5 µg/cm² ≦ Ni+Co ≦ 20 µg/cm², and a cobalt concentration in the coating is desirably 60 mass % or more and 80 mass % or less, preferably 65 mass % or more and 75 mass % or less, and more preferably 70 mass % or more and 75 mass % or less. When the cobalt concentration is less than 60 mass %, the bondability with the base material for a printed circuit board is decreased. On the contrary, even if the cobalt with a concentration greater than 80 mass % is doped, the bonding with the base material for a printed circuit board does not substantially change, and it becomes disadvantageous from the point of view of manufacturing cost, since the cobalt is very expensive in comparison with the nickel.

An example of the treatment condition for the Ni—Co plating will be shown below.

Nickel: 78 g/L
Cobalt: 20 g/L
Solution temperature: 40° C.
pH-value: 4.3 to 4.5
Current density: 1.0 to 3.0 A/dm²
Treatment time: 2 to 5 seconds After providing the Ni—Co alloy plating, the zinc galvanized layer is provided as an underlying layer for the trivalent chromate treatment. The zinc galvanized layer functions to assist a formation of the chromium coating as well as functions as a rust prevention layer for the copper foil 1.

It is preferable that the coating amount of zinc is 0.5 µg/cm² or more and 3 µg/cm² or less. There is such a tendency that if the trivalent chromate treatment condition after the formation of the zinc galvanized layer 4 is identical, the chromium coating amount increases in accordance with the increase of the zinc galvanized coating amount. The detail thereof will be described later. However, it is thought that the formation of the chromium coating is realized by the competitive relationship between the dissolution (elution) of the zinc galvanized layer (underlying layer) 4 and the bonding (deposition) of the chromium coating. In other words, it is required to control the concentration and pH-value of the trivalent chromium conversion treatment solution as well as to control the coating amount of the zinc galvanization, so as to control the aforementioned competition, for obtaining the most suitable chromium coating amount.

If the coating amount of the zinc galvanization is less than 0.5 µg/cm², the zinc galvanized layer 4 does not function as the rust prevention layer and the control of the chromium coating amount will become difficult. On the other hand, if the coating amount of the zinc galvanization is greater than 3 µg/cm², where a printed circuit board is formed by bonding the zinc galvanized layer 4 to the base material for a printed circuit board to and a circuit is formed by etching, there will arise another problem that the zinc exposed at side surfaces of the circuit will be easily eluted by hydrochloric acid or electroless tin plating solution used during the manufacturing process of the printed circuit board. Therefore, there is a disadvantage in that the bonding force is deteriorated due to the decrease of an area bonded to the base material for a printed circuit board.

At this time, the reason why the electroless tin plating is provided is as follows. In the manufacturing process of the printed circuit board, it is required to provide the tin plating which is excellent in the corrosion resistance and solder wettability at a portion connected with other printed circuit boards or electronic members as a connector, or at a solder-bonded portion, following the etching of the copper foil 1 to form the circuit.

Next, an example of the treatment condition for the zinc galvanization will be shown below.

Zinc: 20 g/L
Solution temperature: 17° C. to 22° C.
pH-value: 2.8 to 3.0
Current density: 0.3 to 1.5 A/dm$^2$
Treatment time: 2 to 5 seconds (Silane Coupling Treatment)

For further improving the bonding strength, the silane coupling treatment is conducted following the aforementioned pretreatment to the surface of the copper foil 1 bonded to the base material for a printed circuit board. Although, various kinds of the silane coupling treatment agents are commercially available, since the treatment agent are respectively characterized, it is required to select a treatment agent suitable for the base material for a printed circuit board to be bonded. In particular, when a polyimide is employed as the base material for a printed circuit board, it is effective to use amino silane, preferably aminopropyltrimethoxysilane as the silane coupling treatment agent.

The silane coupling treatment is conducted by immersing the copper foil 1 in the silane coupling treatment solution. In this treatment, it is considered that silanols in the aqueous solution are adsorbed to the OH groups, which mainly exists on a trivalent chromate treatment layer 5 formed on the copper foil 1 or a surface of the underlying metallic layer (zinc galvanized layer 4), so that the silanols are hydrogen bonded thereto.

Following the silane coupling treatment, a drying treatment is promptly conducted. At this time, the hydrogen bonded silanols and hydrogen-bonding parts of the trivalent chromate treatment layer 5 are dehydrated, and heated with a heat (thermal energy) necessary for covalently bonding the hydrogen bonding parts. The hydrogen bonding should be changed to the covalent bonding, a bonding energy is low if the bonding remains in the form of hydrogen-bonding and the effects of the silane coupling treatment cannot be obtained in the hydrogen bonding. On the other hand, if the bonded silanols are heated too much, they will be decomposed by heat. The decomposed parts will become a fragile interface and adversely affect the bonding with the base material for a printed circuit board. Therefore, it is unfavorable to heat the bonded silanols too much.

A drying temperature and a drying time depend on a device configuration and a processing speed of the manufacturing process (work time). A preferable range of the drying temperature is 150 to 300° C., and a preferable range of the drying time is 15 to 35 seconds.

Next, embodiments according to the present invention will be explained below. However, the present invention is not limited to the preferred embodiments.

EMBODIMENTS (Manufacture of Sample)

An electrolytic degreasing treatment is conducted for a rolled copper foil having a thickness of 18 μm by a cathode electrolysis in an aqueous solution containing 40 g/L of sodium hydroxide and 20 g/L of sodium carbonate at a treatment temperature of 40° C. with a current density of 5 A/dm$^2$ for a treatment time of 10 seconds. Following the electrolytic degreasing treatment, a pickling treatment was conducted for the sample in an aqueous solution containing 50 g/L of sulfuric acid at a temperature 25° C. for a treatment time of 10 seconds.

Following the copper roughened plating treatment and Ni—Co plating treatment under conditions shown in TABLE 1, the zinc galvanizing treatment is conducted with varying the current density as shown in TABLE 1. Then, the trivalent chromate coating was conducted for the copper foil with varying the trivalent chromium ion (Cr$^{3+}$) concentration and pH-value of a reaction type chromate treatment solution containing the trivalent chromium (the trivalent chromium ions are provided from the nitric acid chromium, chromium sulfate or chromium chloride, and the pH-value is adjusted by using the nitric acid) as shown in TABLE 1. An immersion time for immersing the copper foil in the trivalent chromium conversion treatment solution was 10 seconds. The pH-value is adjusted by using the nitric acid or oxidation sodium. As explained above, since the effect of the rust prevention (corrosion resistance, oxidation resistance) effect is required in the copper foil surface which is not bonded to the base material (the back side of the bonding side), the Ni—Co plating treatment, zinc galvanizing treatment, and trivalent chromate treatment are conducted for the non-roughened surface to which the copper roughened plating treatment is not conducted.

TABLE 1

Treatment conditions

| Treatment | Liquid Composition | Current Density | Temperature | pH-value |
| --- | --- | --- | --- | --- |
| Cu-roughened plating | Sulfuric acid Cu (Cu: 23 g/L) Sulfuric acid Fe (Fe: 4 g/L) Molybdic acid Na (Mo: 0.3 g/L) Tungstic acid Na (W: 0.3 g/L) | 1st stage M: 40 A/dm$^2$ 2nd stage M: 13 A/dm$^2$ | 40° C. | — |
| Ni—Co plating | Sulfuric acid Ni (Ni: 67 g/L) Chlorination Ni (Ni: 11 g/L) Sulfuric acid Co (Co: 16 g/L) Boric acid (50 g/L) | M: 1.9 A/dm$^2$ S: 1.4 A/dm$^2$ | 40° C. | 4.3 |
| zinc galvanizing | Sulfuric acid Zn (Zn: 22 g/L) | M, S: 0.2-1.4 A/dm$^2$ | 17° C. | 2.6 |
| Trivalent chromate filming | Cr$^{3+}$ (Cr: 0-900 mg/L) | — | 27° C. | 2.6-3.8 |

M: roughened surface,
S: non-roughened surface (Measuring Method of Metal Coating Amount)

Measuring method of each metal coating amounts will be explained below. Following the acid dissolution of metal coatings, the measurement using the Inductively Coupled Plasma-Atomic Emission Spectrophotometer (ICP-AES) is conducted.

At first, the copper foil is cut into a bulk of 40 mm×100 mm. Then, an adhesive tape is bonded closely to a back surface of a measuring surface, so that only the measuring surface dissolves when the acid dissolution is conducted. For the acid dissolution, a nitric acid aqueous solution (expressed as (1+9) nitric acid) is used. The (1+9) nitric acid aqueous solution is composed of a mixture of nitric acid (with the concentration of 60 to 61 mass % and the specific gravity of 1.38) and pure water, and a volume ratio of the nitric acid and pure water is 1:9. By using 30 mL of the (1+9) nitric acid aqueous solution, the coatings on the surface of the copper foil are dissolved, and the copper foil is taken out. Then, the pure water is further added to the dissolution liquid to prepare 100 mL of the dissolution liquid. Concentration of respective metals in this dissolution liquid is measured by the ICP-AES.

(Relationship Between the Current Density for Zinc Galvanization and Zn Film Forming Amount)

For evaluating the relationship between the Zn film forming amount, chromate film forming amount, and Zn film dissolution amount, a reference sample in which only the zinc galvanizing treatment is conducted is prepared. In the reference sample, the trivalent chromate treatment is not conducted. The relationship between the Zn film forming amount, chromate film forming amount, and Zn film dissolution amount will be described in more detail later.

As shown in TABLE 1, the zinc galvanizing treatment is conducted on the roughened surface (M-surface) and the non-roughened surface (S-surface) for a constant time with varying the current density in the range of 0.2 to 1.4 A/dm$^2$, and the Zn film forming amount was measured by the ICP-AES. In addition, the current density conditions in the zinc galvanizing treatment are 0.2 A/dm$^2$, 0.3 A/dm$^2$, 0.6 A/dm$^2$, and 0.9 A/dm$^2$ for the M-surface and 0.3 A/dm$^2$, 0.5 A/dm$^2$, 0.9 A/dm$^2$, 1.4 A/dm$^2$ for the S-surface.

Figure 3:
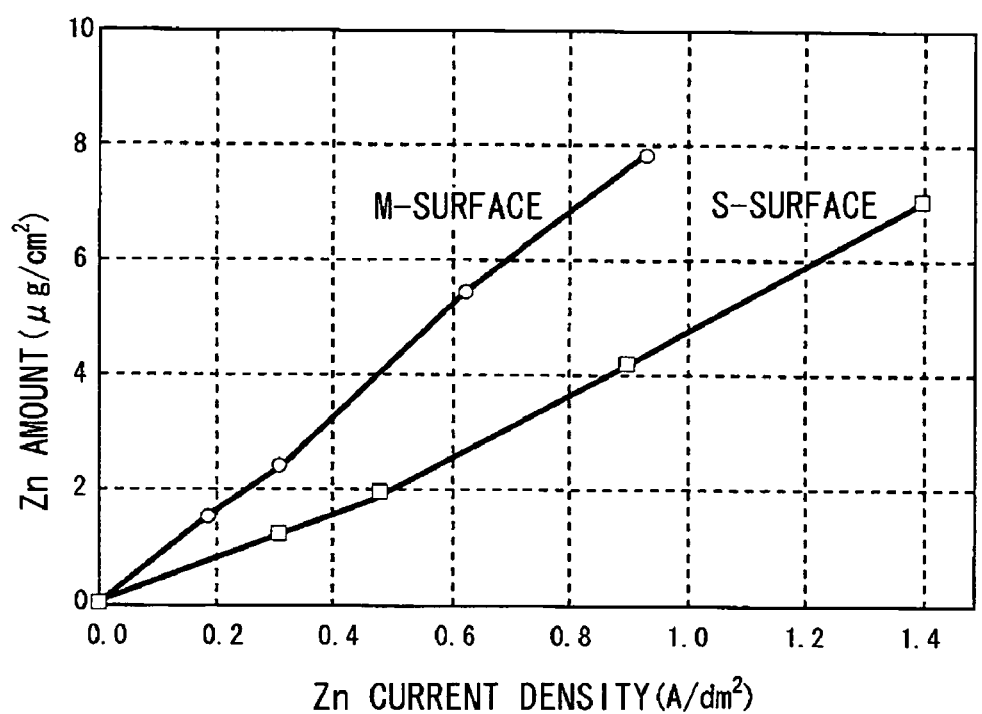
FIG. 3 is a graph showing the relationship between the current density for zinc galvanization and Zn film forming amount.

FIG. 3 is a graph showing the relationship between the current density for the zinc galvanization and Zn film forming amount. As understood from FIG. 3, there is approximately a proportional relationship (linear function) between the current density and Zn film forming amount for both of the M-surface and S-surface. However, it seems that there is a difference in the current use efficiency, since the slopes of the lines are different.

(Relationship Between the Zn Film Forming Amount and Chromate Film Forming Amount)

(Experiment 1)

The zinc galvanizing treatment is conducted under the current density condition identical to those of the reference sample (i.e. under the current density condition for the M-surface and S-surface shown in TABLE 1). Following the zinc galvanizing treatment, the trivalent chromate filming treatment is conducted for the respective samples, by using the chromate treatment solutions (the trivalent chromium ionic concentration is 900 mg/L) adjusted to have the pH-value of 2.6, 3.0, 3.4, and 3.8, respectively. The Zn film forming amount and Cr film forming amount of the respective samples prepared as above are measured by the ICP-AES.

(Experiment 2)

By using a copper foil prepared separately, the zinc galvanizing treatment and the pH adjusted trivalent chromate treatment are conducted under the conditions identical to those for the reference sample, except the trivalent chromium ionic concentration of the chromate treatment solution is 300 mg/L. The Zn film forming amount and Cr film forming amount of the respective samples prepared as above are measured by the ICP-AES.

(Experiment 3)

By using the copper foil prepared separately, the zinc galvanizing treatment and the pH adjusted trivalent chromate treatment are conducted under the conditions identical to those for the reference sample, except the trivalent chromium ionic concentration of the chromate treatment solution is 150 mg/L. The Zn film forming amount and Cr film forming amount of the respective samples prepared as above are measured by the ICP-AES.

(Experiment 4)

By using the copper foil prepared separately, the trivalent chromate treatment is conducted without conducting the zinc galvanizing treatment. The pH-value of the chromate treatment solution for the trivalent chromate treatment is adjusted similarly to that in the Experiment 1, and the trivalent chromium ionic concentration of the chromate treatment solution is 900 mg/L. The Cr film forming amount of the respective samples prepared as above are measured by the ICP-AES.

As understood from a result of the Experiment 4, the chromate film is not formed in any sample. In other words, it is assumed that the presence of a Zn underlying layer is indispensable for the trivalent chromate film formation according to the present invention.

FIGS. 4 to 6 are graphs showing the relationship between the Zn film forming amount and chromate film forming amount in accordance with the organized results of the Experiments 1 to 3.

Figure 4A:
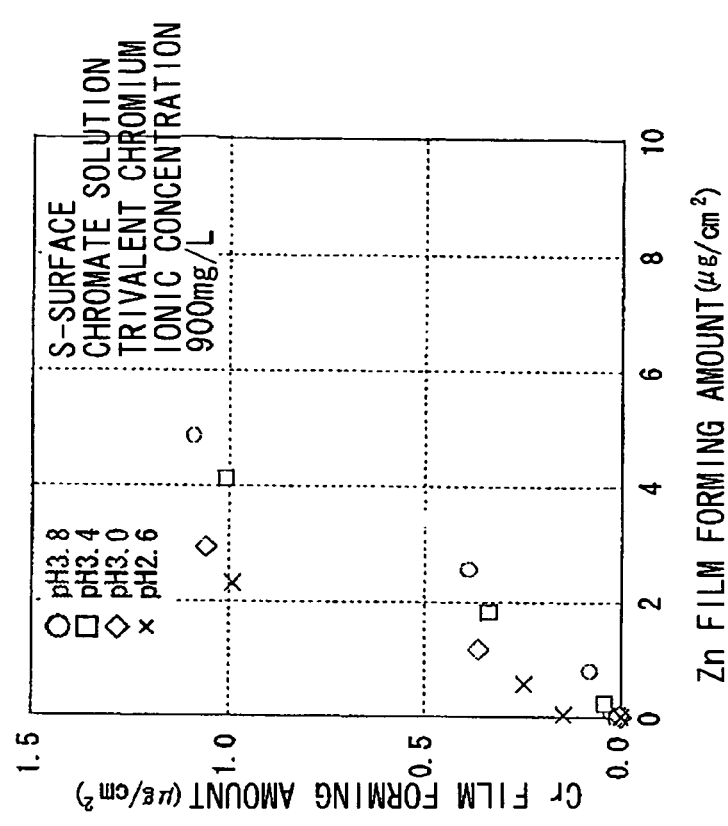
Figure 4B:
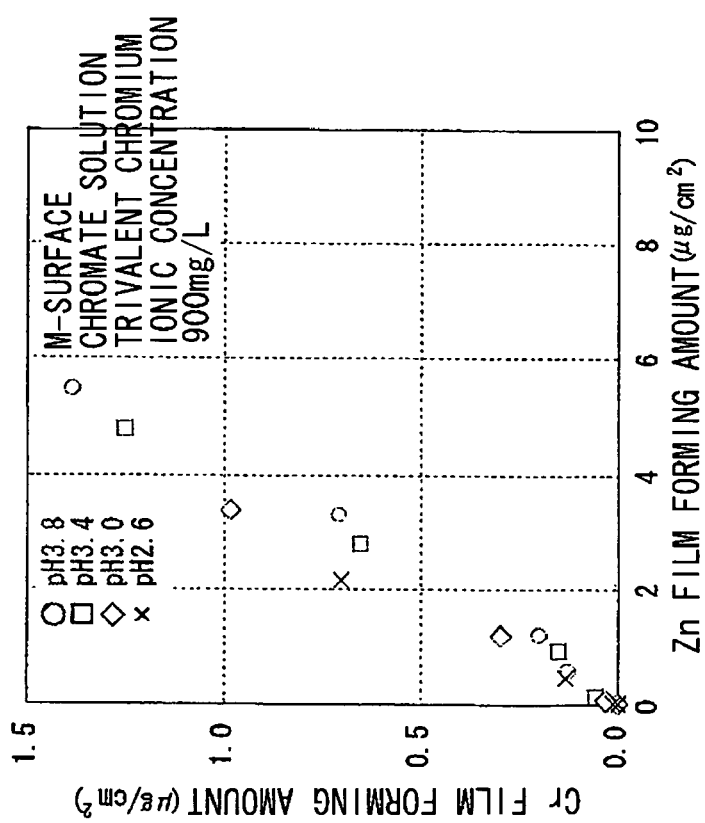

FIGS. 4A and 4B show the Zn film forming amount and Cr film forming amount when using the chromate treatment solution with a trivalent chromium ionic concentration of 900 mg/L (Experiment 1), wherein FIG. 4A shows the relationship between the Zn film forming amount and Cr film forming amount for the S-surface, and FIG. 4B shows the relationship between the Zn film forming amount and Cr film forming amount for the M-surface.

Figure 5A:
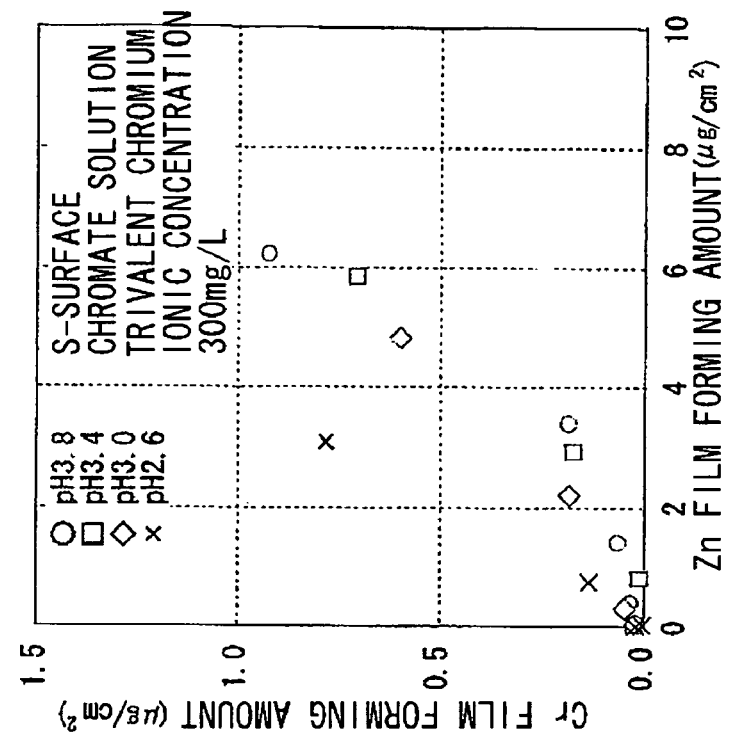
Figure 5B:
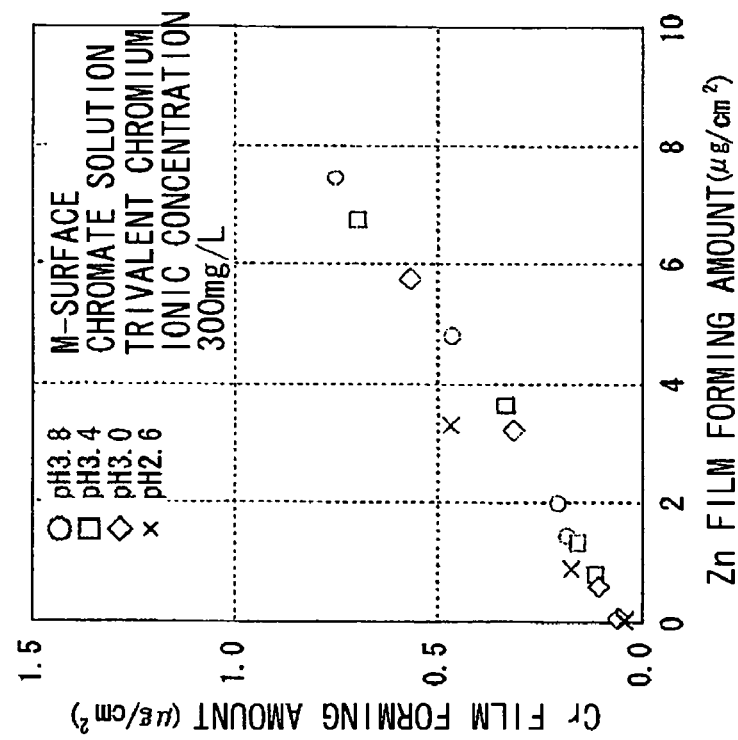

FIGS. 5A and 5B show the Zn film forming amount and Cr film forming amount when using the chromate treatment solution with a trivalent chromium ionic concentration of 300 mg/L (Experiment 2), wherein FIG. 5A shows the relationship between the Zn film forming amount and Cr film forming amount for the S-surface, and FIG. 5B shows the relationship between the Zn film forming amount and Cr film forming amount for the M-surface.

Figure 6A:
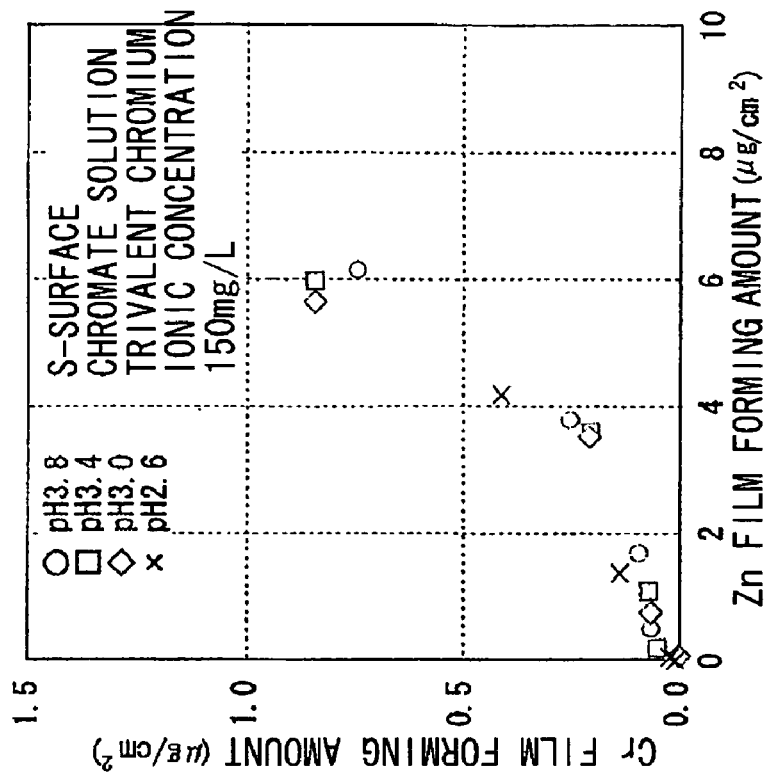
Figure 6B:
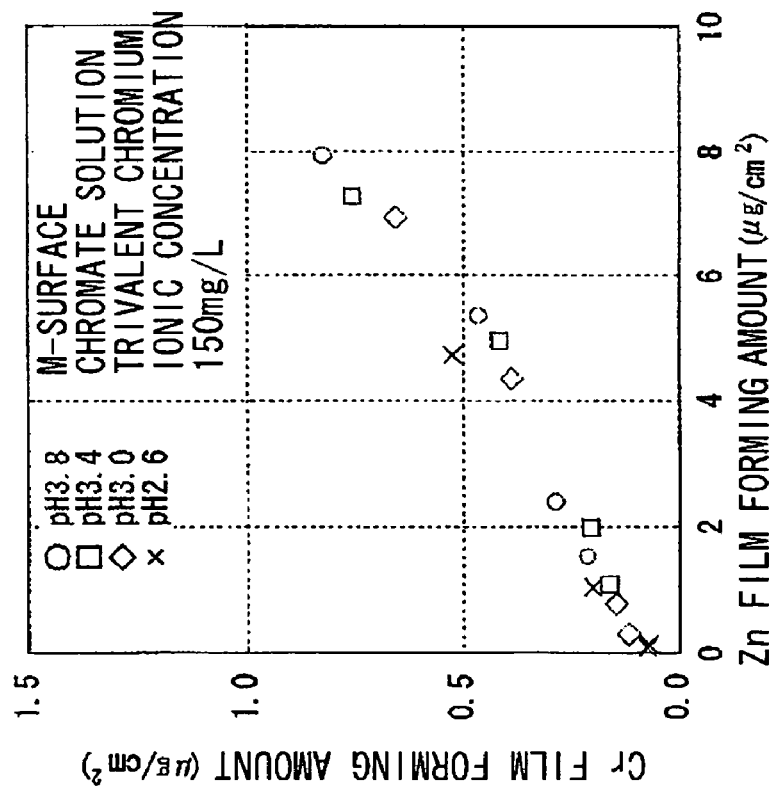

FIGS. 6A and 6B show the Zn film forming amount and Cr film forming amount when using the chromate treatment solution with a trivalent chromium ionic concentration of 150 mg/L (Experiment 3), wherein FIG. 6A shows the relationship between the Zn film forming amount and Cr film forming amount for the S-surface, and FIG. 6B shows the relationship between the Zn film forming amount and Cr film forming amount for the M-surface.

As understood from FIGS. 4 to 6, the chromate film forming amount increases along with the increase of the Zn film forming amount both for the M-surface and S-surface. Therefore, it is found that the control of the film forming amount of the zinc galvanization is required for the control of the chromate film forming amount, as previously described.

The above results can be explained by using the following model.

Figure 7A:
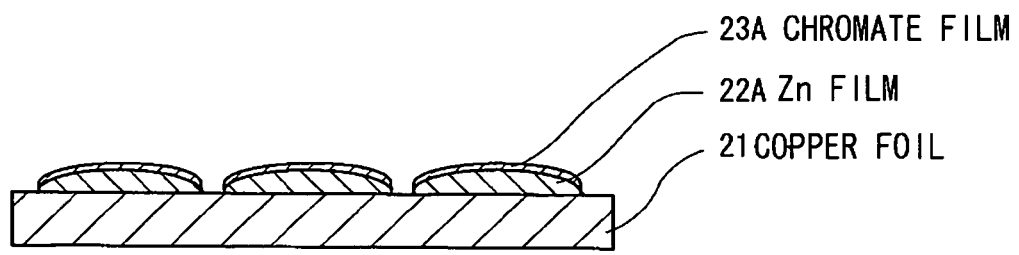
Figure 7B:
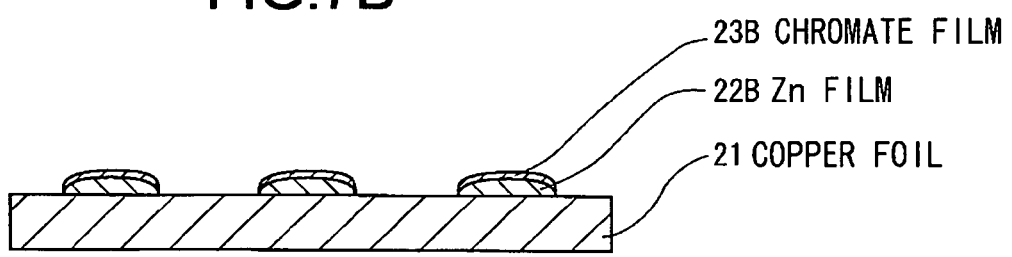

FIGS. 7A and 7B are model schematic diagrams showing a relationship between the Zn film forming amount and chromate film forming amount, wherein FIG. 7A shows a case where the Zn film forming amount is large, and FIG. 7B shows a case where the Zn film forming amount is small.

Converting the treatment coating amount required for the copper foil for FPC into a film thickness, the total thickness of the Zn film and chromate film is around several nanometers to several dozens of nanometers. Since the thickness of the treatment coating is significantly small, it is assumed that the Zn film cannot cover an entire surface of the underlying material uniformly, so that the Zn film is formed in the island shape. In this case, the small and large of the Zn film forming amount is considered to correspond to the increase and decrease of the backing coverage (coverage of the underlying material). On the other hand, as shown in the Experiment 4, the chromate film is not formed when the Zn underlying layer is not provided.

From the above result, it is assumed that the chromate film is formed only on the island-shaped Zn layer (i.e. the formed chromate film only exists on the island). Therefore, the film forming amount of a chromate film 23A increases when the film forming amount of the formed Zn film, e.g. a Zn film 22A formed on a copper foil 21, is large. On the contrary, it seems that the film forming amount of a chromate film 23B decreases, when the film forming amount of the Zn film, e.g. a Zn film 22B is small.

(Relationship Between the pH-Value and Trivalent Chromium Ionic Concentration of the Chromate Treatment Solution and Zn Film Dissolution Amount)

It is however assumed that the Zn film is dissolved due to the solution environment condition represented by the pH-value.

Figure 8A:
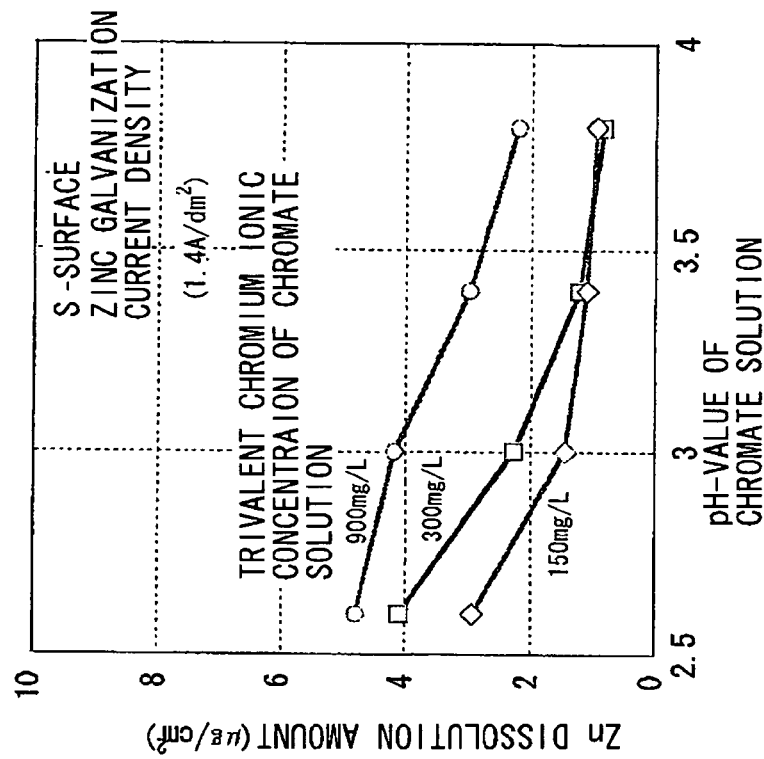
Figure 8B:
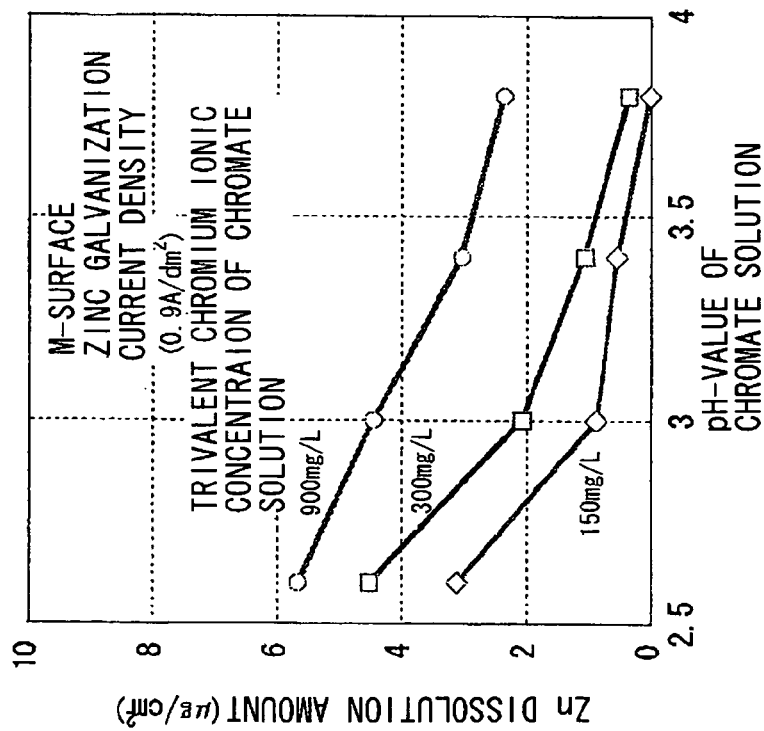

FIGS. 8A and 8B show the relationship between the pH-value and trivalent chromium ionic concentration of the chromate treatment solution and Zn film dissolution amount determined in accordance with the results shown in FIGS. 3 to 6, wherein FIG. 8A shows the relationship thereof for the S-surface, and FIG. 8B shows the relationship thereof for the M-surface. In FIGS. 8A and 8B, a difference between the film forming amount of the Zn film formed by the zinc galvanizing treatment alone (without the trivalent chromate treatment) and the film forming amount of the Zn film formed by both of the zinc galvanizing treatment and trivalent chromate treatment is considered to be the Zn film dissolution amount. FIGS. 8A and 8B show a case where the current densities for the zinc galvanization for the S-surface and M-surface are 0.9 A/dm$^2$ and 1.4 A/dm$^2$ respectively, as a representative example.

As understood from FIGS. 8A and 8B, for both of the M-surface and S-surface, the Zn dissolution amount decreases in accordance with the increase of the pH-value of the chromate treatment solution, and the Zn dissolution amount decreases in accordance with the decrease of the trivalent chromium ionic concentration. Further, the Zn dissolution amount depends on the pH-value of the chromate treatment solution. In addition, the Zn dissolution amount fluctuates in accordance with the variation of the trivalent chromium ionic concentration of the chromate treatment solution even in the same pH-value environment.

As clearly understood from the above results, the excellent controllabitliy of the Zn film forming amount in the chromate treatment can be realized under the conditions of the high pH-value environment (the acidity is kept low) and the relatively low trivalent chromium ionic concentration, since an absolute amount of the Zn dissolution and a fluctuation of the Zn dissolution amount due to variations of the pH-value and trivalent chromium ionic concentration.

(Relationship Between the pH-Value and Trivalent Chromium Ionic Concentration of the Chromate Treatment Solution and the Chromate Film Forming Amount)

Figure 9A:
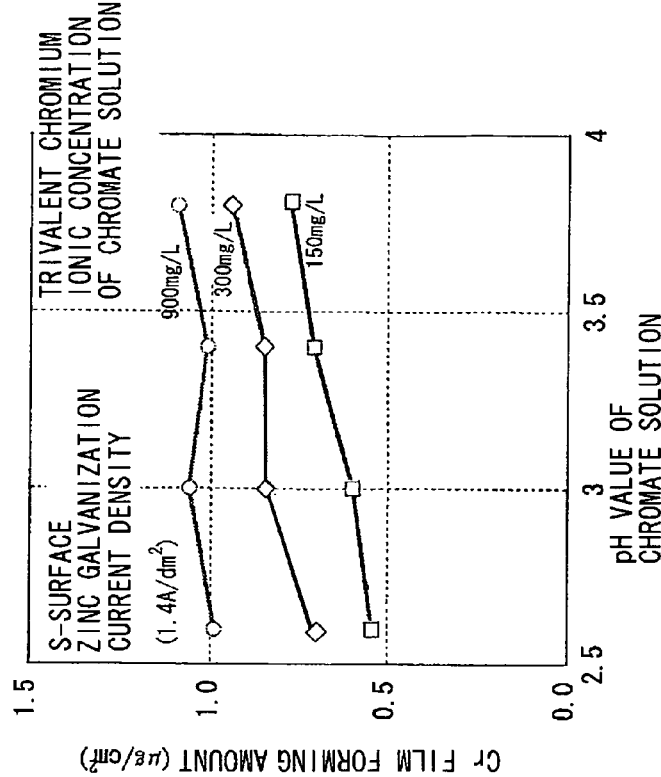
Figure 9B:
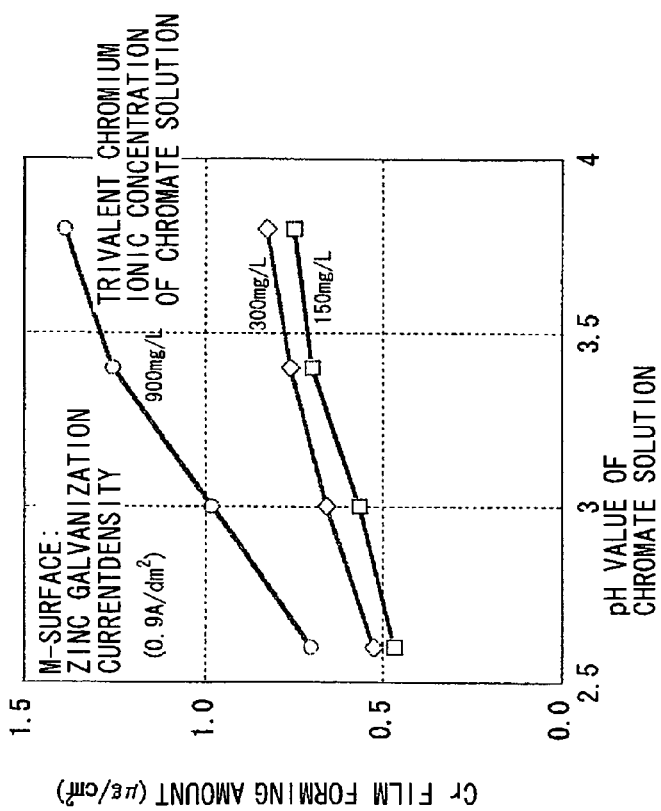

FIGS. 9A and 9B show the relationship between the pH-value and trivalent chromium ionic concentration of the chromate treatment solution and Zn film forming amount determined in accordance with the results shown in FIGS. 4 to 6, wherein FIG. 9A shows the relationship thereof for the S-surface, and FIG. 9B shows the relationship thereof for the M-surface. Similarly to FIGS. 8A and 8B, FIGS. 9A and 9B show a case where the current densities for the zinc galvanization for the S-surface and M-surface are 0.9 A/dm$^2$ and 1.4 A/dm$^2$ respectively, as a representative example.

As understood from FIGS. 9A and 9B, for both of the M-surface and S-surface, the Zn film forming amount increases in accordance with the increase of the pH-value of the chromate treatment solution, and the Zn film forming amount increases in accordance with the increase of the trivalent chromium ionic concentration.

Based on the above results, the formation process of the chromate film will be assumed as follows. Immersed into the chromate treatment solution, the Zn underlying layer locally dissolves in accordance with the pH-value of the chromate treatment solution ($H^+$ concentration in the solution). A local elevation of the pH-value (the increase of $OH^-$ concentration) occurs because of $H^+$ consumption generated by the Zn dissolution. In accordance with the increase of the $OH^-$ concentration, a part of coordinated water of $Cr^{3+}$ changes into $OH^-$, so that a hidroxo complex (e.g. $[Cr(H_2O)_3(OH)_3]$ is generated. Following the cross-linking (olation) by the $OH^-$, a semi-gel coating is deposited on a surface of the Zn. It is assumed that the olation of the semi-gel coating progresses in a following drying process, and the three-dimension configuration is completed, so that the chromate film is finally formed.

Further, according to the above generation process (reaction mechanism), the pH-value of the solution is preferably not greater than 4.5, as described above. Namely, if the pH-value of the solution is greater than 4.5, the precipitation and deposition will easily occur in the plating solution, and it will become difficult to control the formation of the chromium film. In other words, when the pH-value of the chromate treatment solution is within a range where the stability of the chromium ions in the chromate treatment solution can be assured, the pH-value ($OH^-$ concentration) by which the chromate coating reaction progresses is obtained even if the dissolution amount of Zn is small. Therefore, it is possible to conduct the chromate film formation with a high efficiency.

In addition, the chromate film forming amount increases in accordance with the increase of the trivalent chromium ionic concentration of the chromate treatment solution. This result can be explained in consideration of the increase the Zn dissolution amount (cf. FIGS. 8A and 8B) and the solubility in the chromate treatment solution.

Referring to FIGS. 9A and 9B, the variation of the trivalent chromium ionic concentration involved with the chromate film formation and the stability (controllability) of chromate film forming amount are considered. Particularly for the M-surface, the variation of the chromate film forming amount in the chromate treatment solution with the trivalent chromium ionic concentration of 150 to 300 mg/L is smaller than that in the chromate treatment solution with the trivalent chromium ionic concentration of 900 mg/L. In other words, the controllability of chromate film forming amount is more excellent when the chromate treatment solution with a relatively low trivalent chromium ionic concentration is used.

As understood from the above explanation, by using the chromate treatment solution with the trivalent chromium ionic concentration of 150 to 300 mg/L and the pH-value of 3.0 to 4.5, the dissolution of the Zn underlying layer and the affect of variable factors on the chromate film forming amount can be decreased, so that the controllability of the film formation of the Zn underlying layer and chromate film can be improved.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching herein set forth.

What is claimed is:

1. A copper foil for a printed circuit board comprising:
a copper foil comprising copper or copper alloy and having a surface to be faced to a base material for a printed circuit board;
a zinc galvanized layer provided on a bonding surface of the copper foil; and
a trivalent chromate treatment layer directly formed on the zinc galvanized layer;
wherein the trivalent chromate treatment layer is formed by using a trivalent chromium conversion treatment solution containing 70 mg/L or more and less than 500 mg/L of trivalent chromium ions converted into metal chromium and having a pH-value of 3.0 to 4.5; and
wherein an alloy plating layer composed of Ni and Co is provided between the zinc galvanized layer and the copper foil, and wherein a total coating amount of the Ni and Co is 5 to 20 $\mu g/cm^2$, and a concentration of the cobalt in the alloy layer is 60 to 80 mass %.

2. A copper foil for a printed circuit board comprising:
a copper foil comprising copper or a copper alloy and having a surface to be faced to a base material for a printed circuit board;
a zinc galvanized layer provided on a bonding surface of the copper foil; and
a trivalent chromate treatment layer directly formed on the zinc galvanized layer;
wherein the trivalent chromate treatment layer is formed as a trivalent chromate film by using a trivalent chromium conversion treatment solution comprising 70 mg/L or more and less than 500 mg/L of trivalent chromium ions converted into metal chromium and having a pH-value of 3.0 to 4.5,
wherein the trivalent chromium conversion treatment solution is substantially free of hexavalent chromium ions,
wherein the trivalent chromium comprises nitric acid chromium, chromium sulfate, or chromium chloride, and
wherein an alloy plating layer composed of Ni and Co is provided between the zinc galvanized layer and the copper foil.

3. The copper foil for a printed circuit board, according to claim 2, wherein:
a coating amount of the Zn of the zinc galvanized layer is 0.5 to 3 $\mu g/cm^2$.

4. A copper foil according to claim 2, wherein the treatment solution comprises 110 mg/L or more and 400 mg/L or less of trivalent chromium ions.

5. A copper foil according to claim 2, wherein the treatment solution comprises 150 mg/L or more and 300 mg/L or less of trivalent chromium ions.

6. A copper foil according to claim 2, wherein the pH value of the chromate treatment solution is between 3.5 and 4.0.

7. A copper foil according to claim 2, wherein the pH value of the chromate treatment solution is between 3.6 and 3.8.

8. A printed circuit board comprising the copper foil according to claim 2.

* * * * *